United States Patent
Lin et al.

(10) Patent No.: US 7,176,504 B1
(45) Date of Patent: Feb. 13, 2007

(54) SIGE MOSFET WITH AN EROSION PREVENTING $SI_{X1}GE_{Y1}$ LAYER

(75) Inventors: Huan-Shun Lin, Taichung (TW); Hung-Lin Shih, Hsinchu (TW); Hsiang-Ying Wang, Chiai (TW); Jih-Shun Chiang, Changhua County (TW); Min-Chi Fan, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/162,904

(22) Filed: Sep. 28, 2005

(51) Int. Cl.
*H01L 31/00* (2006.01)

(52) U.S. Cl. ............... 257/192; 257/19; 257/55; 257/63; 257/616; 257/E31.049; 257/E21.207

(58) Field of Classification Search ............ None
See application file for complete search history.

(56) References Cited

U.S. PATENT DOCUMENTS 4,533,935 A * 8/1985 Mochizuki ............ 257/538
7,009,200 B2 * 3/2006 Tezuka et al. ............ 257/19
2003/0227057 A1 * 12/2003 Lochtefeld et al. ......... 257/347
2005/0045905 A1 * 3/2005 Chu et al. ............... 257/103

* cited by examiner

*Primary Examiner*—Leonardo Andujar
*Assistant Examiner*—Scott R. Wilson
(74) *Attorney, Agent, or Firm*—Jianq Chyun IP Office

(57) ABSTRACT

A semiconductor device is provided. The semiconductor device comprises a substrate, a gate structure, a spacer, a $Si_xGe_y$ layer and a $Si_xGe_y$ protection layer. The gate structure is deposited on the substrate and the spacer is deposited on the sidewalls of the gate structure. The $Si_xGe_y$ layer is deposited in the substrate on both sides of the spacer and extended to a portion beneath part of the spacer. In addition, the top level of the $Si_xGe_y$ layer is higher than the surface of the substrate. Moreover, the $Si_xGe_y$ protection layer is deposited on the $Si_xGe_y$ layer and the $Si_xGe_y$ protection layer comprises $Si_{x1}Ge_{y1}$, where $0 \leqq y1 < y$.

9 Claims, 2 Drawing Sheets

SIGE MOSFET WITH AN EROSION PREVENTING $SI_{X1}GE_{Y1}$ LAYER

BACKGROUND OF THE INVENTION

1. Field of the Invention

The present invention relates to a structure of an integrated circuit (IC) device, and more particularly, to a semiconductor device.

2. Description of the Related Art

Once the gate length of the silicon metal-oxide semiconductor (MOS) transistor device is reduced to a deep submicron range, because the carrier passing time decreases along with the decrease of the channel length, a device with better performance is obtained. However, many problems still need to be solved in the aspect of fabricating technique thereof. For example, when the device is becoming smaller, the size of the source/drain area reduces accordingly, which increases the contact resistance of the source/drain terminal, thus the device fails to maintain the original high current driving capability.

In order to resolve the problem mentioned above, a silicon-germanium ($Si_xGe_y$) technique has been developed for fabricating an MOS transistor with raised source/drain. Since the silicon-germanium can be selectively grown in the source/drain area as well as selectively etched compared to silicon and silicon oxide, silicon-germanium is a more suitable material for fabricating semiconductor devices compared to silicon. Moreover, since silicon-germanium has a lower energy width than that of silicon, a lower schottky barrier height is existed on the p-type junction, which reduces the contact resistance.

However, the MOS transistor with raised source/drain fabricated by the silicon-germanium technique is likely to cause problems such as film damages during the subsequent fabricating process, for example, in the subsequent cleaning process. Consequently, the reliability of the fabricating process is affected.

SUMMARY OF THE INVENTION

Therefore, it is an object of the present invention to provide a semiconductor device which prevents the raised source/drain film from being worn down or damaged, thus the reliability of the fabricating process and the device performance are not impacted.

It is another object of the present invention to provide another semiconductor device which prevents the raised source/drain film from being worn down or damaged, thus the reliability of the fabricating process and the device performance are not impacted.

The present invention provides a semiconductor device which comprises a substrate, a gate structure, a spacer, a $Si_xGe_y$ layer and a $Si_xGe_y$ protection layer. The gate structure is deposited on the substrate and the spacer is deposited on the sidewalls of the gate structure. The $Si_xGe_y$ layer is deposited in the substrate on both sides of the spacer and extended to a portion beneath part of the spacer. In addition, the top level of the $Si_xGe_y$ layer is higher than the surface of the substrate. Moreover, the $Si_xGe_y$ protection layer is deposited on the $Si_xGe_y$ layer and the $Si_xGe_y$ protection layer comprises $Si_xGe_y$, where $0 \leq y1 < y$.

In accordance with an embodiment of the present invention, the semiconductor device mentioned above further comprises a metal silicide layer. The metal silicide layer is deposited in part of the $Si_xGe_y$ protection layer and on the gate structure, wherein the thickness ratio of the metal silicide layer and the $Si_xGe_y$ protection layer is between 0.5~1.0. The material of the metal silicide layer is a refractory metal silicide, for example, and the refractory metal is selected from a group consisting of Ti (titanium), W (tungsten), Pt (platinum), Co (cobalt) and Ni (nickel).

The present invention further provides another semiconductor device. The semiconductor device comprises a substrate, a gate structure, a spacer, a $Si_xGe_yB_z$ layer and a $Si_xGe_yB_z$ protection layer. The gate structure is deposited on the substrate, and the spacer is deposited on the sidewalls of the gate structure. The $Si_xGe_yB_z$ layer is deposited in the substrate on both sides of the spacer and extended to a portion beneath part of the spacer. In addition, the top level of the $Si_xGe_yB_z$ layer is higher than the surface of the substrate. Moreover, the $Si_xGe_yB_z$ protection layer is deposited on the $Si_xGe_yB_z$ layer and the $Si_xGe_yB_z$ protection layer comprises $Si_{x1}Ge_{y1}B_{z1}$, where $0 < y1 < y$ and $0 < z1 < z$.

In accordance with an embodiment of the present invention, the semiconductor device mentioned above further comprises a metal silicide layer. The metal silicide layer is deposited in part of the $Si_xGe_yB_z$ protection layer and on the gate structure, wherein the thickness ratio of the metal silicide layer and the $Si_xGe_yB_z$ protection layer is between 0.5~1.0. The material of the metal silicide layer is a refractory metal silicide, for example, and the refractory metal is selected from a group consisting of Ti (titanium), W (tungsten), Pt (platinum), Co (cobalt) and Ni (nickel).

In accordance with an embodiment of the present invention, the concentration of boron (B) in the $Si_xGe_yB_z$ layer is between $5 \times 10^{19} \sim 5 \times 10^{20}$ atoms/cm$^3$.

A $Si_xGe_y$ protection layer or a $Si_xGe_yB_z$ protection layer is deposited in the semiconductor device of the present invention, which prevents the film underneath the $Si_xGe_y$ layer or the $Si_xGe_yB_z$ layer from being worn down or damaged, thus the reliability of the fabricating process and the device performance are not impacted. In addition, the content of Ge (germanium) in the $Si_xGe_y$ protection layer or the $Si_xGe_yB_z$ protection layer is lower than the content of Ge (germanium) in the $Si_xGe_y$ layer or the $Si_xGe_yB_z$ layer that the etch rate of the subsequent cleaning process is slowed down and the underneath $Si_xGe_y$ layer or the $Si_xGe_yB_z$ layer is prevented from being eroded. On the other hand, a metal silicide layer may be formed by the $Si_xGe_y$ protection layer or the $Si_xGe_yB_z$ protection layer, which also prevents the underneath $Si_xGe_y$ layer or the $Si_xGe_yB_z$ layer from being worn down.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DESCRIPTION OF THE PREFERRED EMBODIMENTS

Figure 1:
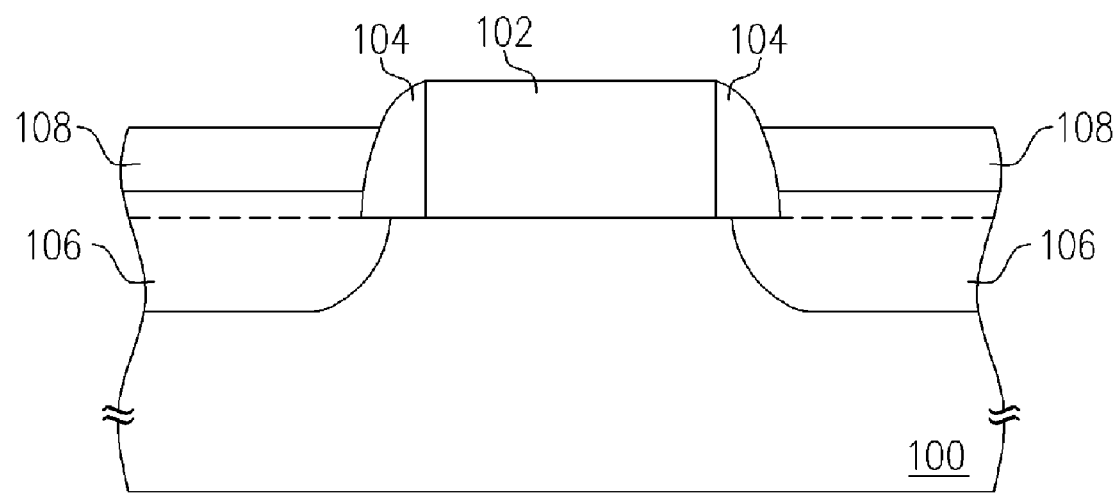
FIG. 1 schematically shows a cross-sectional view of a semiconductor device according to a first embodiment of the present invention.

FIG. 1 schematically shows a cross-sectional view of a semiconductor device according to a first embodiment of the present invention.

Referring to FIG. 1, the semiconductor device of the present invention comprises a substrate 100, a gate structure 102, a spacer 104, a $Si_xGe_y$ layer 106 and a $Si_xGe_y$ protection layer 108. The substrate 100 may be a silicon substrate or other appropriate semiconductor substrate. The gate structure 102 is deposited on the substrate 100, and the gate structure 102 may be comprised of a gate dielectric layer (not shown) and a gate conductive layer (not shown). The material and forming method thereof are well known to one of the ordinary skill in the art, thus its detail is omitted herein. The spacer 104 is deposited on the sidewalls of the gate structure 102. Moreover, the spacer 104 may be a single-layer spacer structure or a multi-layer spacer structure. The multi-layer spacer structure is composed of at least one offset spacer and one spacer.

In addition, the $Si_xGe_y$ layer 106 is deposited in the substrate 100 on both sides of the spacer 104, and the $Si_xGe_y$ layer 106 is extended to a portion beneath part of the spacer 104. The top level of the $Si_xGe_y$ layer 106 is higher than the surface of the substrate 100. Wherein, the content of silicon-germanium in the $Si_xGe_y$ layer 106 is represented by $Si_xGe_y$, and x+y<1. Moreover, it is to be noted that the so-called raised source/drain is formed by the $Si_xGe_y$ layer 106, which provides a lower resistance and reduces the leakage current. However, the $Si_xGe_y$ layer 106 may cause the film being lost or damaged in the subsequent fabricating process. As a result, the reliability of the fabricating process and the device performance are affected.

Accordingly, in order to resolve the problem mentioned above, the semiconductor device of the present invention deposits a $Si_xGe_y$ protection layer 108 on the $Si_xGe_y$ layer 106. To be more specific, the $Si_xGe_y$ protection layer 108 can prevent the underneath $Si_xGe_y$ layer 106 from being eroded by the cleaning agent during the subsequent cleaning process. In addition, the content of silicon-germanium in the $Si_xGe_y$ protection layer 108 is represented by $Si_{x1}Ge_{y1}$, where x1+y1<1 and $0 \leq y1 < y$. In more detail, the content of Ge (germanium) in the $Si_xGe_y$ protection layer 108 is lower than the content of Ge (germanium) in the $Si_xGe_y$ layer 106, which lowers down the etch rate of the subsequent cleaning process and also prevents the underneath $Si_xGe_y$ layer 106 from being eroded, such that the $Si_xGe_y$ layer 106 is properly protected.

Figure 2:
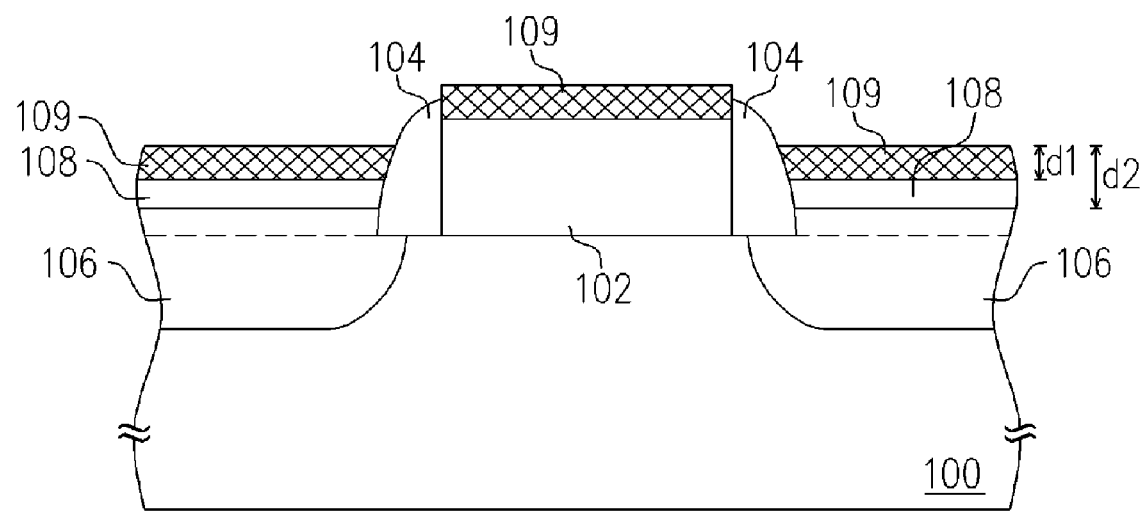
FIG. 2 schematically shows a cross-sectional view of a semiconductor device according to a second embodiment of the present invention.

Referring to FIG. 2, the semiconductor device according to an embodiment of the present invention further comprises a metal silicide layer 109. The metal silicide layer 109 is deposited in part of the $Si_xGe_y$ protection layer 108 and on the gate structure 102. The material of the metal silicide layer 109 is a refractory metal silicide, for example, wherein the refractory metal is selected from a group consisting of Ti (titanium), W (tungsten), Pt (platinum), Co (cobalt) and Ni (nickel). In addition, the metal silicide layer 109 is formed from the interaction with the silicon atoms in the $Si_xGe_y$ protection layer 108 beneath it, and at least half of the $Si_xGe_y$ protection layer 108 is used up. Thus, the thickness ratio (d1/d2) of the metal silicide layer 109 and the $Si_xGe_y$ protection layer 108 is between 0.5~1.0. It is to be noted that the $Si_xGe_y$ protection layer 108 of the semiconductor device may be used for forming the metal silicide layer 109, which protects the $Si_xGe_y$ layer 106 from being worn down.

Figure 3:
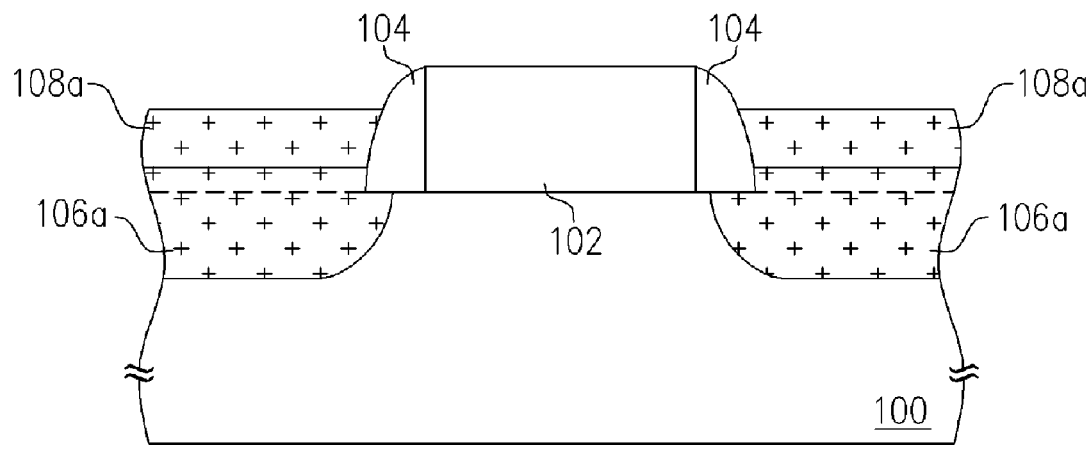
FIG. 3 schematically shows a cross-sectional view of a semiconductor device according to a third embodiment of the present invention.

FIG. 3 schematically shows a cross-sectional view of a semiconductor device according to a third embodiment of the present invention. Referring to FIG. 3, the semiconductor device of the present invention comprises a substrate 100, a gate structure 102, a spacer 104, a $Si_xGe_yB_z$ layer 106a and a $Si_xGe_yB_z$ protection layer 108a. The substrate 100, the gate structure 102, and the spacer 104 are the same devices described in the previous embodiment, thus they are indicated by the same number and the details are omitted herein. Moreover, the $Si_xGe_yB_z$ layer 106a is deposited in the substrate 100 on both sides of the spacer 104 and the $Si_xGe_yB_z$ layer 106a is extended to a portion beneath part of the spacer 104. The top level of the $Si_xGe_yB_z$ layer 106a is higher than the surface of the substrate 100. The material of the $Si_xGe_yB_z$ layer 106a is represented by $Si_xGe_yB_z$, and x+y+z<1. Furthermore, the concentration of boron (B) in the $Si_xGe_yB_z$ layer 106a is between $5 \times 10^{19} \times 5 \times 10^{20}$ atoms/cm$^3$.

In addition, the $Si_xGe_yB_z$ protection layer 108a is deposited on the $Si_xGe_yB_z$ layer 106a and the material of the $Si_xGe_yB_z$ protection layer 108a is represented by $Si_xGe_yB_z$, where x1+y1+z1<1 and 0<y1<y. Similarly, the $Si_xGe_yB_z$ protection layer 108a can prevent the film of the underneath $Si_xGe_yB_z$ layer 106a from being worn down or damaged during the subsequent fabricating process. Moreover, the content of Ge (germanium) in the $Si_xGe_yB_z$ protection layer 108a is lower than the content of Ge (germanium) in the $Si_xGe_yB_z$ layer 106a that the etch rate of the subsequent cleaning process is slowed down and the underneath $Si_xGe_yB_z$ layer 106a is prevented from being eroded.

Figure 4:
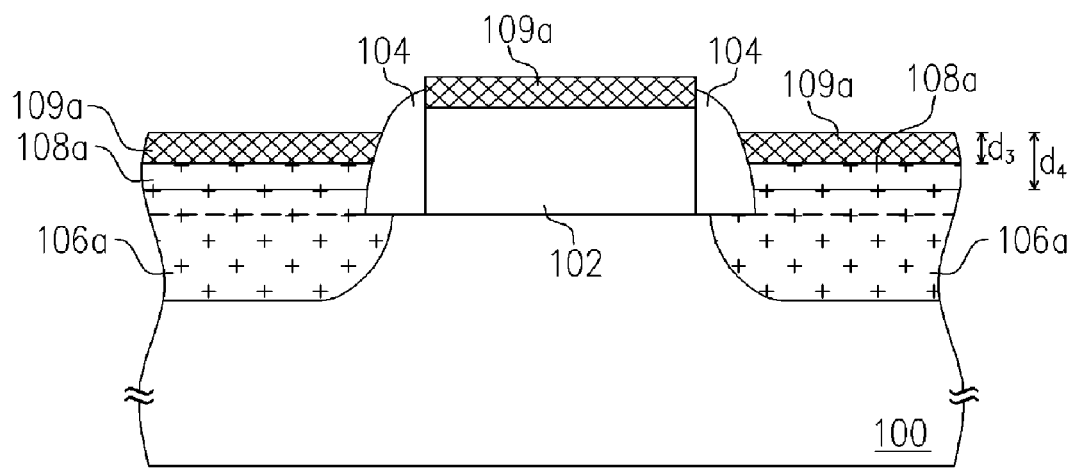
FIG. 4 schematically shows a cross-sectional view of a semiconductor device according to a fourth embodiment of the present invention.

Referring to FIG. 4, the semiconductor device according to a fourth embodiment of the present invention further comprises a metal silicide layer 109a. Wherein, the metal silicide layer 109a is deposited in part of the $Si_xGe_yB_z$ protection layer 108a and on the gate structure 102. The material of the metal silicide layer 109 is a refractory metal silicide, for example, wherein the refractory metal is selected from a group consisting of Ti (titanium), W (tungsten), Pt (platinum), Co (cobalt), and Ni (nickel). In addition, the thickness ratio (d3/d4) of the metal silicide layer 109 and the $Si_xGe_yB_z$ protection layer 108a is between 0.5~1.0. Similarly, it is to be noted that the $Si_xGe_yB_z$ protection layer 108a of the semiconductor device may be used for forming the metal silicide layer 109, which protects the $Si_xGe_y$ layer 106 from being worn down.

Of course, although the source/drain of the semiconductor device in the present invention is mainly made of silicon and germanium, it may be made by boron (B) or other atoms and should not be limited by $Si_xGe_y$ or $Si_xGe_yB_z$.

In summary, the present invention at least has the following advantages:

1. The semiconductor device of the present invention has a $Si_xGe_y$ protection layer or a $Si_xGe_yB_z$ protection layer, which can prevent the film of the $Si_xGe_y$ layer or the $Si_xGe_yB_z$ layer from being worn down or damaged during the subsequent fabricating process; and the reliability of the fabricating process and the device performance are not affected.

2. The content of Ge (germanium) in the $Si_xGe_y$ protection layer or the $Si_xGe_yB_z$ protection layer is lower than the content of Ge (germanium) in the $Si_xGe_y$ layer or the $Si_xGe_yB_z$ layer, which slows down the etch rate of the subsequent cleaning process and prevents the underneath $Si_xGe_y$ layer or the $Si_xGe_yB_z$ layer from being eroded, such that the $Si_xGe_y$ layer or the $Si_xGe_yB_z$ layer is properly protected.

3. In the semiconductor device of the present invention, the metal silicide layer may be formed by the $Si_xGe_y$ layer or the $Si_xGe_yB_z$ layer, thus the $Si_xGe_y$ layer or the $Si_xGe_yB_z$ layer will not be worn down.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A SiGe MOSFET with an erosion preventing $Si_{x1}Ge_{y1}$ layer, comprising:
   a substrate;
   a gate structure deposited on the substrate;
   a spacer deposited on the sidewalls of the gate structure;
   a $Si_xGe_y$ layer deposited in the substrate on both sides of the spacer and extended to a portion beneath the spacer, wherein a top level of the $Si_xGe_y$ layer is higher than a surface of the substrate; and
   the erosion preventing $Si_{x1}Ge_{y1}$ for preventing the $Si_xGe_y$ layer from erosion deposited on the $Si_xGe_y$ layer, wherein $0 \leq y1 < y$.

2. The SiGe MOSFET of claim 1, further comprising a metal silicide layer deposited in a part of the erosion preventing $Si_{x1}Ge_{y1}$ layer and on the gate structure, wherein the thickness ratio of the metal silicide layer and the erosion preventing $Si_{x1}Ge_{y1}$ layer is between 0.5~1.0.

3. The SiGe MOSFET of claim 2, wherein the material of the metal silicide layer comprises a refractory metal silicide.

4. The SiGe MOSFET of claim 3, wherein the refractory metal is selected from a group consisting of Ti (titanium), W (tungsten), Pt (platinum), Co (cobalt) and Ni (nickel).

5. A SiGe MOSFET with an erosion preventing $Si_{x1}Ge_{y1}B_{z1}$ layer, comprising:
   a substrate;
   a gate structure deposited on the substrate;
   a spacer deposited on the sidewalls of the gate structure;
   a $Si_xGe_yB_z$ layer deposited in the substrate on both sides of the spacer and extended to a portion beneath the spacer, wherein a top level of the $Si_{x1}Ge_{y1}B_z$ layer is higher than a surface of the substrate; and
   the erosion preventing $Si_{x1}Ge_{y1}B_{z1}$ layer for preventing the $Si_xGe_yB_z$ layer from erosion deposited on the $Si_{x1}Ge_{y1}B_{z1}$ layer, wherein $0<y1<y$ and $0<z1<z$.

6. The SiGe MOSFET of claim 5, further comprising a metal silicide layer deposited in a part of the erosion preventing $Si_{x1}Ge_{y1}B_{z1}$ layer and on the gate structure, wherein the thickness ratio of the metal silicide layer and the erosion preventing $Si_{x1}Ge_{y1}B_{z1}$ layer is between 0.5~1.0.

7. The SiGe MOSFET of claim 6, wherein the material of the metal silicide layer comprises a refractory metal silicide.

8. The SiGe MOSFET of claim 7, wherein the refractory metal is selected from a group consisting of Ti (titanium), W (tungsten), Pt (platinum), Co (cobalt) and Ni (nickel).

9. The SiGe MOSFET of claim 5, wherein the concentration of boron (B) in the erosion preventing $Si_{x1}Ge_{y1}B_{z1}$ layer is between $5\times10^{19}$~$5\times10^{20}$ atoms/cm$^3$.

* * * * *